(12) United States Patent
Lin et al.

(10) Patent No.: US 11,064,618 B2
(45) Date of Patent: Jul. 13, 2021

(54) ELECTRIC DEVICE AND HOUSING STRUCTURE THEREOF

(71) Applicant: PEGATRON CORPORATION, Taipei (TW)

(72) Inventors: Kuan-Ting Lin, Taipei (TW); Wen-Cheng Tsai, Taipei (TW); Jr-Hung Huang, Taipei (TW); Danny Sun, Taipei (TW); Ho-Ching Huang, Taipei (TW); Nien-Yu Chang, Taipei (TW); Ming-Ke Chou, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/841,091

(22) Filed: Apr. 6, 2020

(65) Prior Publication Data

US 2020/0367371 A1    Nov. 19, 2020

(30) Foreign Application Priority Data

May 17, 2019 (TW) ................................ 10811721.3

(51) Int. Cl.
*H05K 5/00* (2006.01)
*H05K 5/06* (2006.01)
*G06F 1/16* (2006.01)

(52) U.S. Cl.
CPC .......... *H05K 5/0056* (2013.01); *G06F 1/1658* (2013.01); *H05K 5/069* (2013.01); *H05K 5/0052* (2013.01)

(58) Field of Classification Search
CPC .... H05K 5/0056; H05K 5/069; H05K 5/0052; H05K 5/02; H05K 5/0004; G06F 1/1658; G06F 1/182
See application file for complete search history.

(56) References Cited

U.S. PATENT DOCUMENTS 5,107,404 A * 4/1992 Tam .......................... H04B 1/38
361/736
5,142,444 A * 8/1992 Matta ................. H01L 21/67138
165/185

(Continued)

FOREIGN PATENT DOCUMENTS

CN      103987214 A    8/2014
CN      204795966 U    11/2015
(Continued)

*Primary Examiner* — Abhishek M Rathod
(74) *Attorney, Agent, or Firm* — Muncy, Geissler, Olds & Lowe, P.C.

(57) ABSTRACT

The application discloses an electronic device including a motherboard and a housing structure. The motherboard has a first surface and a second surface. The housing structure includes a first casing, a first cushion, a second casing, and a second cushion. The first casing has at least one first fixing member. The first cushion covers the first surface, is accommodated in the first casing and has at least one first through hole. The second casing has at least one second fixing member. The second cushion covers the second surface, is accommodated in the second casing and has at least one second through hole. A peripheral edge of the first cushion is attached to a peripheral edge of the second cushion, and the first fixing member may be fixed to the second fixing member through the first through hole and the second through hole.

16 Claims, 5 Drawing Sheets

(56) References Cited

U.S. PATENT DOCUMENTS

| | | | | |
|---|---|---|---|---|
| 5,302,853 | A | * | 4/1994 | Volz .................... H01L 23/4093 257/707 |
| 5,552,967 | A | * | 9/1996 | Seto ...................... G06F 1/1616 174/387 |
| 6,188,576 | B1 | * | 2/2001 | Ali ...................... G06K 19/077 174/17 R |
| 6,288,866 | B1 | * | 9/2001 | Butler .................... G11B 33/08 360/97.19 |
| 6,624,432 | B1 | * | 9/2003 | Gabower ............. H04B 1/3838 174/384 |
| 6,791,838 | B1 | * | 9/2004 | Hung ................. H01L 23/4006 165/185 |
| 7,505,262 | B2 | * | 3/2009 | Mizuno ................ G06F 1/1656 312/223.1 |
| 7,532,477 | B2 | * | 5/2009 | Hsu ...................... H05K 7/2049 165/80.3 |
| 8,767,407 | B2 | * | 7/2014 | Lim ..................... H05K 9/0028 361/753 |
| 8,834,192 | B2 | * | 9/2014 | Terhune, IV ........ H05K 7/1053 439/331 |
| 8,879,263 | B2 | * | 11/2014 | Gunderson ........ H05K 7/20472 361/708 |
| 9,621,696 | B2 | | 4/2017 | Hung |
| D795,823 | S | * | 8/2017 | Aoyagi ........................ D13/182 |
| 10,185,372 | B1 | * | 1/2019 | Heller ...................... H05K 5/04 |
| 10,709,027 | B2 | * | 7/2020 | Tsao ........................ H05K 5/006 |
| 10,916,831 | B2 | * | 2/2021 | Yeh ........................... H01Q 9/30 |
| 2006/0050430 | A1 | * | 3/2006 | Byun .................... G11B 25/043 360/99.15 |
| 2006/0050431 | A1 | * | 3/2006 | Byun .................... G11B 33/122 360/99.13 |
| 2006/0067054 | A1 | * | 3/2006 | Wang ...................... H01L 23/42 361/704 |
| 2006/0098332 | A1 | * | 5/2006 | Lee ........................ G11B 33/08 360/97.19 |
| 2007/0258207 | A1 | * | 11/2007 | Su ........................ H01L 23/4006 361/679.46 |
| 2008/0017174 | A1 | * | 1/2008 | Kafer .................. H05K 7/20854 123/479 |
| 2008/0073186 | A1 | * | 3/2008 | Kenmochi ............. H04M 1/23 200/5 A |
| 2011/0310565 | A1 | * | 12/2011 | He ...................... H01L 23/3672 361/715 |
| 2012/0162950 | A1 | * | 6/2012 | Liu ........................ G06F 1/1637 361/807 |
| 2013/0128482 | A1 | * | 5/2013 | Qin ...................... H05K 9/0026 361/764 |
| 2014/0198263 | A1 | * | 7/2014 | Hsu .......................... H04N 5/64 348/794 |
| 2018/0247881 | A1 | * | 8/2018 | Lizuka .................. H01L 23/433 |
| 2019/0325188 | A1 | * | 10/2019 | Jo ........................... G06F 21/32 |

FOREIGN PATENT DOCUMENTS

| | | |
|---|---|---|
| CN | 205505321 U | 8/2016 |
| CN | 207505255 U | 6/2018 |
| TW | M291546 | 6/2006 |
| TW | 201433241 A | 8/2014 |

* cited by examiner

ELECTRIC DEVICE AND HOUSING STRUCTURE THEREOF

CROSS-REFERENCE TO RELATED APPLICATION

This non-provisional application claims priority under 35 U.S.C. § 119(a) to Patent Application No. 108117213 filed in Taiwan, R.O.C. on May 17, 2019, the entire contents of which are hereby incorporated by reference.

BACKGROUND

Technical Field

The application relates to a housing of an electronic device, and in particular, to a housing applied to an industrial computer.

Related Art

Generally, various tests such as an impact test, a drop test, and a dust-proof test should be performed on a housing of an electronic device to meet requirements for specifications such as firmness, dust prevention, and explosion prevention. For an industrial computer that is often used in a harsh environment, higher requirements are imposed on specifications such as firmness, dust prevention, and explosion prevention. Before the foregoing tests are performed, an aging test needs to be performed first on the housing, for example, high-temperature processing for 28 days and low-temperature processing for one day, and then the foregoing impact test, the drop test, and the dust-proof test are performed successively. After the aging test is performed on the housing, structural strength of the housing is greatly weakened, making the housing difficult to pass the dust-proof test. As a result, dust may enter an interior of the electronic device, and the explosion prevention cannot be achieved.

At present, the structural strength of the housing of the electronic device is reinforced to attempt to pass the aging test and the dust-proof test. However, this method has a high failure rate, that is, after the structural strength of the housing is reinforced, most of housings still cannot pass the aging test and the dust-proof test. In addition, the structural strength of the housing is generally reinforced through increasing a thickness or adding other designs for reinforcing the structure. Nevertheless, the foregoing method affects an appearance of the housing of the electronic device, and it is difficult to maintain an original (before reinforcing the structural strength of the housing) appearance of the housing, and therefore it is necessary to improve the foregoing method.

SUMMARY

In view of the foregoing issue, the application is intended to provide an electronic device and a housing structure thereof. A first cushion and a second cushion of the housing structure cover two opposite side faces of a motherboard, to resolve a problem that a conventional electronic device and most of housing structures thereof fail to pass an aging test and a dust-proof test.

In order to achieve the foregoing objective, the application provides an electronic device, including a motherboard and a housing structure. The motherboard has a first surface and a second surface opposite to each other. The housing structure includes a first casing, a first cushion, a second casing, and a second cushion. The first casing has at least one first fixing member. The first cushion covers the first surface of the motherboard and is accommodated in the first casing. The first cushion has at least one first through hole. The second casing has at least one second fixing member. The second cushion covers the second surface of the motherboard and is accommodated in the second casing. The second cushion has at least one second through hole. A peripheral edge of the first cushion is attached to a peripheral edge of the second cushion, and the first fixing member may be fixed to the second fixing member through the first through hole and the second through hole.

In order to achieve the foregoing objective, the application further provides a housing structure of an electronic device. The electronic device includes a motherboard having a first surface and a second surface opposite to each other. The housing structure includes a first casing, a first cushion, a second casing, and a second cushion. The first casing has at least one first fixing member. The first cushion covers the first surface of the motherboard and is accommodated in the first casing. The first cushion has at least one first through hole. The second casing has at least one second fixing member. The second cushion covers the second surface of the motherboard and is accommodated in the second casing. The second cushion has at least one second through hole. A peripheral edge of the first cushion is attached to a peripheral edge of the second cushion, and the first fixing member may be fixed to the second fixing member through the first through hole and the second through hole.

According to an embodiment of embodiments, the motherboard has a heating unit, and the first cushion or the second cushion has a heat dissipation portion, the heat dissipation portion is in contact with the heating unit.

According to an embodiment of the embodiments, the first cushion and the second cushion are soft members.

According to an embodiment of the embodiments, the first cushion and the second cushion are made of a heat-resistant material.

According to an embodiment of the embodiments, the first cushion has at least one first side wall, and the second cushion has at least one second side wall, when the first cushion covers the first surface of the motherboard and the second cushion covers the second surface of the motherboard, the first side wall is attached to the second side wall to cover the motherboard.

According to an embodiment of the embodiments, the first cushion has a first inner surface, a surface profile of the first inner surface mates with a surface profile of the first surface of the motherboard, so that the first inner surface is capable of attaching to the first surface of the motherboard. The second cushion has a second inner surface, a surface profile of the second inner surface mates with a surface profile of the second surface of the motherboard, so that the second inner surface is capable of attaching to the second surface of the motherboard.

According to an embodiment of the embodiments, the first cushion or the second cushion includes a wire opening, and the housing structure further includes a waterproof adhesive material, the waterproof adhesive material is filled in the wire opening.

According to an embodiment of the embodiments, a peripheral edge of the first cushion or the second cushion is coated with a waterproof adhesive material.

Carrying on with the foregoing, according to the electronic device and the housing structure thereof of the application, the housing structure includes the first casing, the first cushion, the second casing, and the second cushion. The first cushion covers the first surface of the motherboard and is accommodated in the first casing. The second cushion covers the second surface of the motherboard and is accommodated in the second casing. Through the foregoing structure, the motherboard is covered between the first cushion and the second cushion, and the motherboard, the first cushion, and the second cushion are jointly accommodated between the first casing and the second casing. The first cushion and the second cushion cover the motherboard to simultaneously achieve effects of dust prevention, explosion prevention, and shock absorption. In addition, in the interiors of the first casing and the second casing, the first cushion and the second cushion are configured to protect the motherboard, so that even if a negative pressure is drawn due to the explosion-proof test to cause dust to enter the interiors of the first casing and the second casing, the dust may be still prevented from being in contact with the motherboard. Therefore, the explosion-proof test may be passed without reinforcing the strength of the first casing and the second casing and without reducing a current of the motherboard.

DETAILED DESCRIPTION OF THE EMBODIMENTS

For a clearer understanding of the features, contents, and advantages of the application and the effects that can be achieved by the application, the application is described in detail below in the form of embodiments and with reference to the accompanying drawings.

Figure 1:
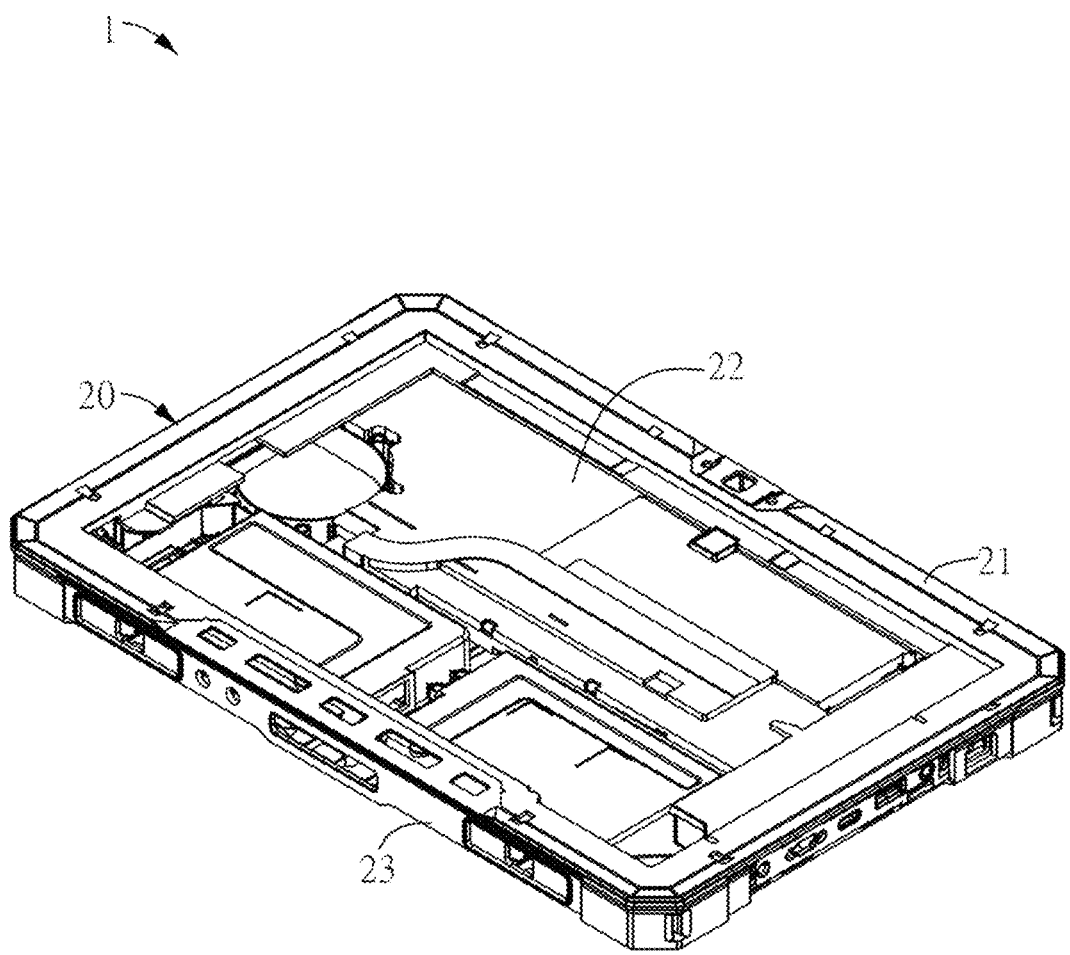
FIG. 1 is a schematic diagram of an electronic device according to an embodiment of the application.
Figure 2:
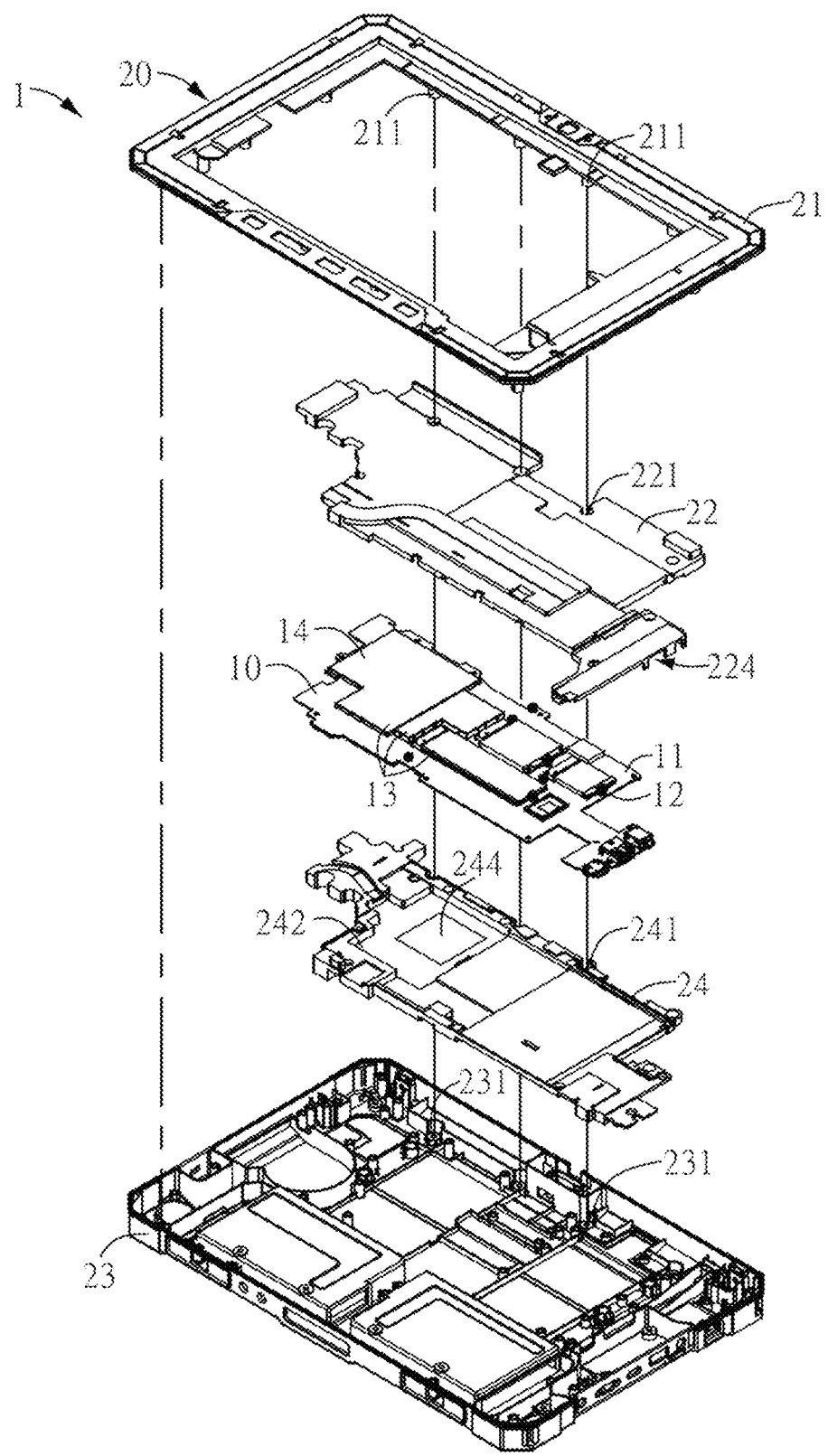
FIG. 2 is a schematic exploded view of the electronic device shown in FIG. 1.

Referring to FIG. 1 and FIG. 2 together, FIG. 1 is a schematic diagram of an electronic device according to an embodiment of the application, and FIG. 2 is a schematic exploded view of the electronic device shown in FIG. 1. An electronic device 1 of this embodiment includes a motherboard 10 and a housing structure 20, and the motherboard 10 is disposed in an interior of the housing structure 20. The motherboard 10 has a first surface 11 and a second surface 12 opposite to each other. FIG. 2 is used as an example. The first surface 11 is a surface on an upper side of the motherboard 10, and the second surface 12 is a surface on a lower side of the motherboard 10. It should be noted that the second surface 12 of FIG. 2 is marked on a side line of the lower side of the motherboard 10, or reference may also be first made to FIG. 5. The electronic device 1 of this embodiment may be applied to an industrial computer, that is, may be applied to an industrial computer with relatively high requirements for specifications such as strength, dust prevention, and explosion prevention of the housing structure 20. The housing structure 20 includes a first casing 21, a first cushion 22, a second casing 23, and a second cushion 24.

The first casing 21 and the second casing 23 are hard members, and the first cushion 22 and the second cushion 24 are soft members.

The first casing 21 has at least one first fixing member 211. Correspondingly, the second casing 23 has at least one second fixing member 231. The first fixing member 211 and the second fixing member 231 may be a buckle set. For example, the first fixing member 211 may be a male buckle, and the second fixing member 231 is a female buckle. Therefore, the quantity of first fixing members 211 is the same as that of second fixing members 231. In other embodiments, the first fixing member 211 may be a female buckle, and the second fixing member 231 is correspondingly a male buckle, which is not limited in the application. The first casing 21 and the second casing 23 are fixed through a connection relation between the first fixing member 211 and the second fixing member 231, and details thereof are further described later. It should be noted that the first casing 21 is a member for installation of a display screen, for example, installed in an intermediate hollow area of the first casing 21 shown in FIG. 1 and FIG. 2.

Figure 3:
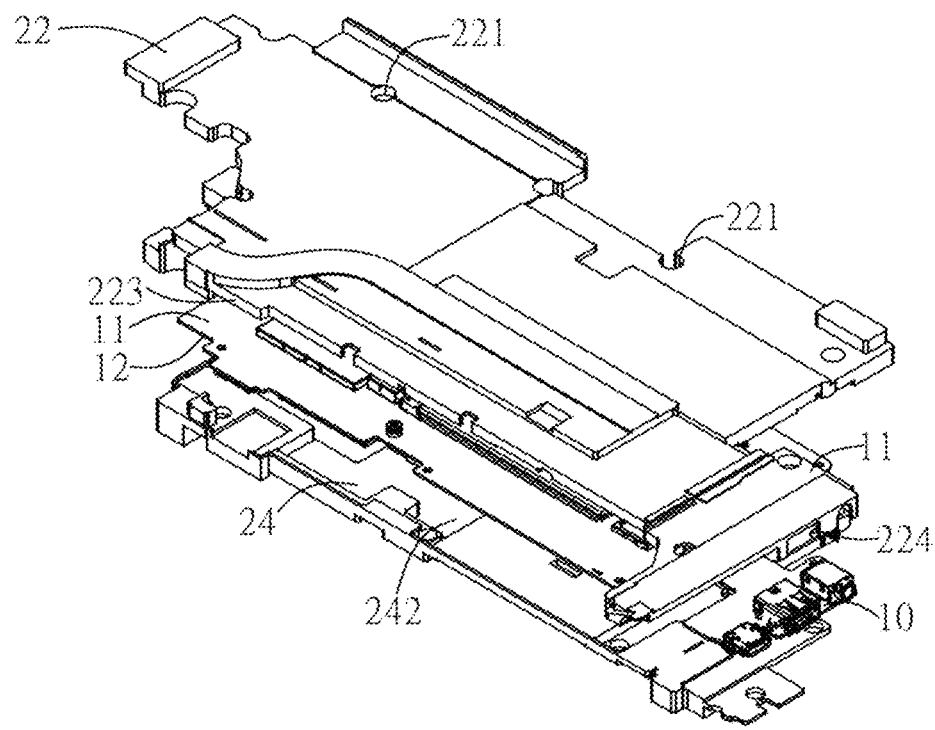
FIG. 3 is a schematic exploded view of a first cushion, a motherboard, and a second cushion shown in FIG. 2.
Figure 4:
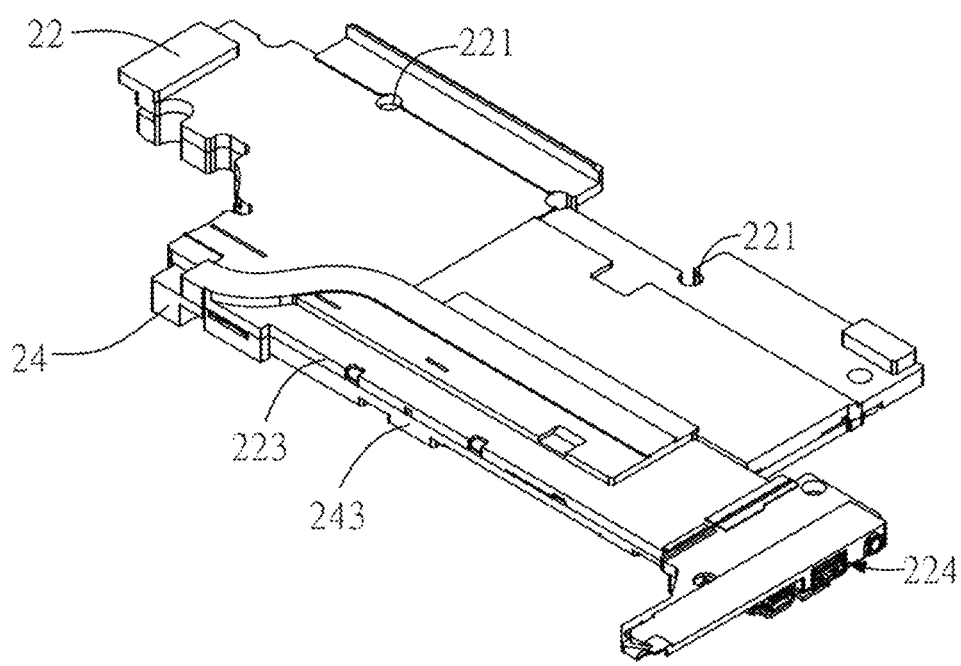
FIG. 4 is a schematic assembled view of the first cushion, the motherboard, and the second cushion shown in FIG. 3.

Referring to FIG. 3 and FIG. 4, FIG. 3 is a schematic exploded view of a first cushion, a motherboard, and a second cushion shown in FIG. 2, and FIG. 4 is a schematic assembled view of the first cushion, the motherboard, and the second cushion shown in FIG. 3. The first cushion 22 covers the first surface 11 of the motherboard 10, and the second cushion 24 covers the second surface 12 of the motherboard 10. In other words, the first cushion 22 and the second cushion 24 each cover an upper side and a lower side of the motherboard 10, so that the motherboard 10 is covered between the first cushion 22 and the second cushion 24.

In addition, the first cushion 22 has at least one first through hole 221, and the second cushion 24 has at least one second through hole 241. The quantity of first through holes 221 is the same as the quantity of second through holes 241, and a position of the first through hole corresponds to that of the second through hole, so that one first through hole 221 and one second through hole 241 jointly form a via. The via is configured to accommodate the first fixing member 211 and the second fixing member 231. Therefore, the quantity of first through holes 221 (or the second through holes 241) in this embodiment are equal to the quantity of first fixing members 211 (or second fixing members 231).

The motherboard 10, the first cushion 22, and the second cushion 24 are jointly accommodated in an accommodation space between the first casing 21 and the second casing 23. When the electronic device 1 is assembled, the second cushion 24 may first pass through the second through hole 241, and the second cushion 24 is accommodated in the second casing 23. Next, the motherboard 10 is placed on an inner surface (which is referred to as a second inner surface 242 herein) of the second cushion 24, and the second surface 12 of the motherboard 10 faces toward the second inner surface 242. Next, the first cushion 22 may cover the first surface 11 of the motherboard 10, and an inner surface (which is referred to as a first inner surface 222 herein) of the first cushion 22 faces toward the first surface 11 of the motherboard 10. It should be noted that, in this embodiment, a surface that is of the first cushion 22 and that corresponds to the side of the motherboard 10 is referred to as the first inner surface 222 (refer to FIG. 5 first), and a surface that is of the second cushion 24 and that corresponds to the side of the motherboard 10 is referred to as the second inner surface 242.

After the first cushion 22 covers the first surface 11 of the motherboard 10, a peripheral edge of the first cushion 22 is attached to a peripheral edge of the second cushion 24, so that the motherboard 10 is covered between the first cushion 22 and the second cushion 24, and the first through hole 221 and the second through hole 241 may jointly form a via. Finally, the first fixing member 211 of the first casing 21 passes through the via jointly formed by the first through hole 221 and the second through hole 241, so that the first fixing member 211 (a male buckle) is engaged with the second fixing member 231 (a female buckle) to fix the first casing 21 and the second casing 23. In this case, the first cushion 22 is accommodated in the first casing 21.

Definitely, a sequence in which the motherboard 10, the first cushion 22, and the second cushion 24 are assembled is not limited in the application. It is only necessary that the motherboard 10 is covered between the first cushion 22 and the second cushion 24, and the motherboard 10, the first cushion 22, and the second cushion 24 are jointly accommodated between the first casing 21 and the second casing 23. For example, the first cushion 22 may be first accommodated in the first casing 21, and then the motherboard 10, the second cushion 24, and the second casing 23 are sequentially assembled. In addition, alternatively, the first cushion 22 may be accommodated in the first casing 21, and then the second cushion 24 may be accommodated in the second casing 23. Next, the motherboard 10 is accommodated between the first casing 21 and the second casing 23. Finally, the first casing 21 is assembled to the second casing 23.

When the first casing 21 is assembled to the second casing 23, the peripheral edge of the first cushion 22 is capable of attaching to the peripheral edge of the second cushion 24, and the first fixing member 211 (the male buckle) may be connected to the second fixing member 231 (the female buckle) through the first through hole 221 and the second through hole 241. In this way, the first casing 21 may be fixedly connected to the second casing 23, and the first cushion 22 and the second cushion 24 that cover the motherboard 10 may further be attached to each other, to achieve a dust-proof effect. In addition, dust may be prevented from entering the motherboard 10 and being in contact with the electronic device to achieve an explosion-proof effect. Furthermore, since the first cushion 22 and the second cushion 24 are soft members, shock absorption may further be implemented to protect the motherboard 10. Preferably, the first cushion 22 has at least one first side wall 223, and the second cushion 24 has at least one second side wall 243. When the peripheral edge of the first cushion 22 is attached to the peripheral edge of the second cushion 24, the first side wall 223 is also attached to the second side wall 243. Side edges of the motherboard 10 are covered using the first side wall 223 and the second side wall 243, to improve the effects of the dust prevention and explosion prevention.

In addition, in a conventional technology, strength of the housing (such as the first casing 21 and the second casing 23 of this embodiment) is reinforced, or a current of the motherboard is reduced, to pass the explosion-proof test. In this embodiment, through interiors of the first casing 21 and the second casing 23, the first cushion 22 and the second cushion 24 are configured to protect the motherboard 10. Even if a negative pressure is drawn to cause dust to enter the interiors of the first casing 21 and the second casing 23, since the motherboard 10 is covered between the first cushion 22 and the second cushion 24, dust may be still prevented from being in contact with the motherboard 10, to achieve an explosion-proof effect. In other words, the explosion-proof test may be passed without reinforcing the strength of the first casing 21 and the second casing 23 and without reducing the current of the motherboard 10.

Referring to FIG. 2 and FIG. 3, the first cushion 22 includes a wire opening 224 for a line of the motherboard 10 to pass through the first cushion 22 and the second cushion 24, so that the line may be connected to an I/O connecting port. In other embodiments, alternatively, the second cushion 24 has a wire opening, or both the first cushion 22 and the second cushion 24 have wire openings for a line of the motherboard 10 to pass, which is not limited in the application. Preferably, the housing structure 20 further includes a waterproof adhesive material (not shown). After the line of the motherboard 10 passes through the wire opening 224, the waterproof adhesive material may be filled in the wire opening 224. The waterproof adhesive material may not only improve the foregoing effects of dust prevention and explosion prevention, but also achieve a water-proof effect. In addition, alternatively, the peripheral edge (s) of the first cushion 22 or (and) the second cushion 24 may be coated with the waterproof adhesive material, to increase sealing performance of the first cushion 22 and the second cushion 24 and improve the effects of dust prevention and explosion prevention.

Figure 5:
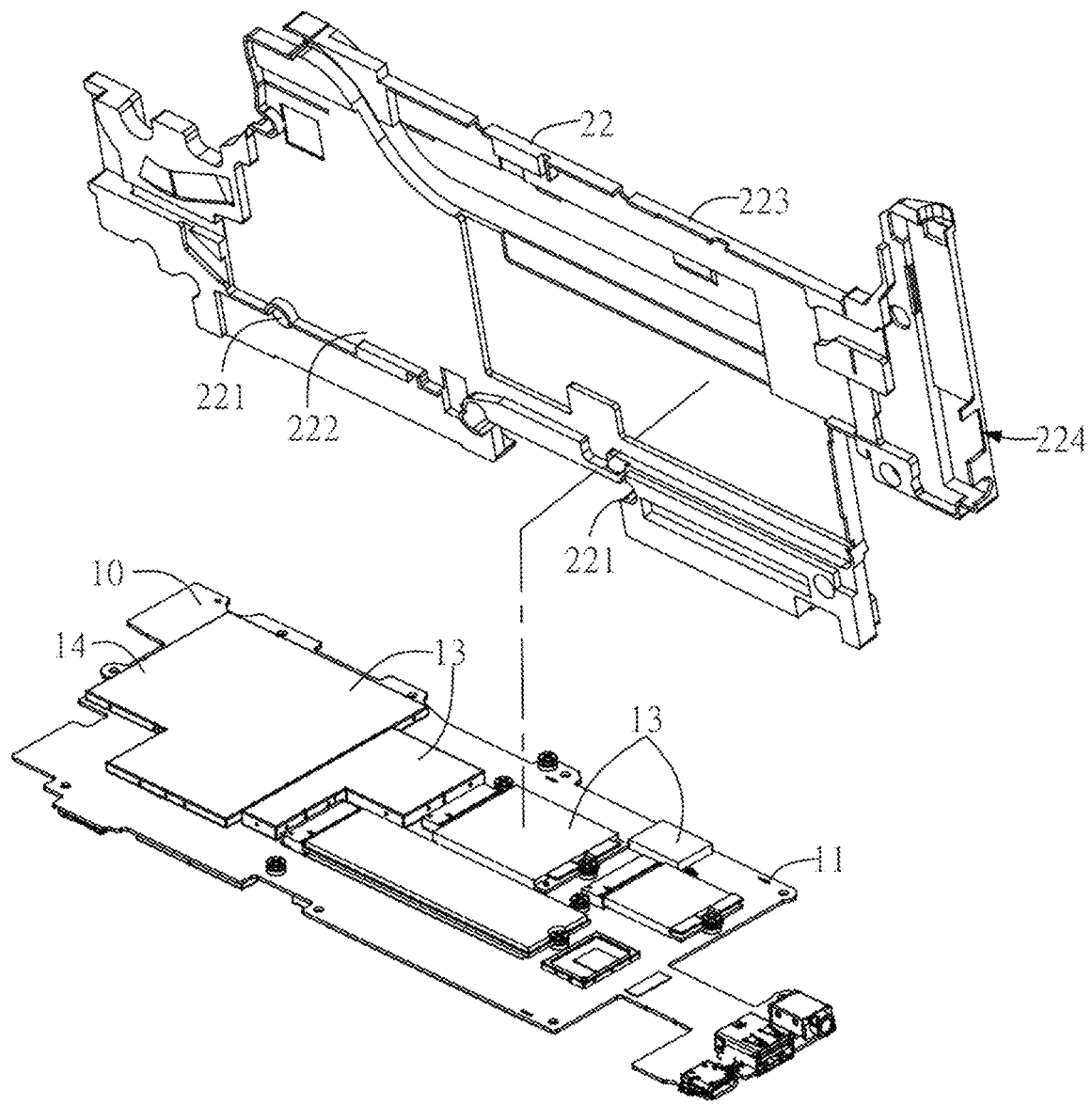
FIG. 5 is a schematic diagram of the first cushion and the motherboard shown in FIG. 3.
Figure 6:
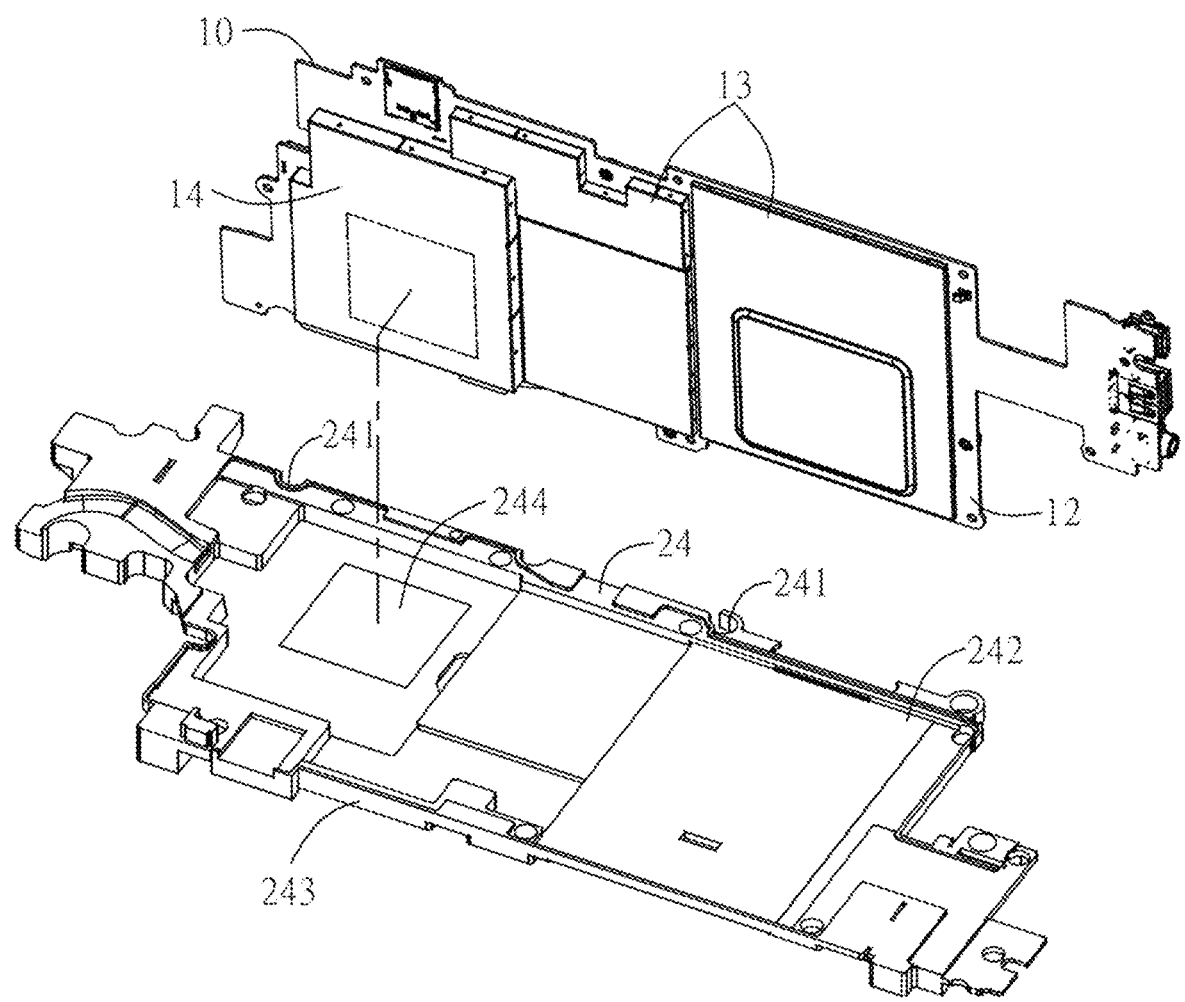
FIG. 6 is a schematic diagram of the motherboard and the second cushion shown in FIG. 2.

Referring to FIG. 2 and FIG. 5, FIG. 5 is a schematic diagram of the first cushion and the motherboard shown in FIG. 2. A first inner surface 222 of a first cushion 22 shown in FIG. 5 faces upward. Preferably, a surface profile of the first inner surface 222 mates with a surface profile of a first surface 11 of a motherboard 10. Alternatively, the first inner surface 222 may have a plurality of concave portions, and is disposed at a position corresponding to a module 13 of the motherboard 10. When the first cushion 22 covers the first surface 11 of the motherboard 10, the protruding module 13 may be accommodated in a concave portion of the first inner surface 222, so that the first inner surface 222 is capable of attaching to the first surface 11 of the motherboard 10. Referring to FIG. 2 and FIG. 6, FIG. 6 is a schematic diagram of the motherboard and the second cushion shown in FIG. 2. A second surface 12 of the motherboard 10 shown in FIG. 6 faces upward. Similarly, a surface profile of the second inner surface 242 mates with a surface profile of the second surface 12 of the motherboard 10. That is, the second inner surface 242 may have a plurality of concave portions or convex portions, and is disposed at a position corresponding to the module 13 of the motherboard 10. When the second cushion 24 covers the second surface 12 of the motherboard 10, the second inner surface 242 is capable of attaching to the second surface 12 of the motherboard 10. The surface profile of the first inner surface 222 mates with the surface profile of the first surface 11, and the surface profile of the second inner surface 242 mates with the surface profile of the second surface 12, so that a gap between the first cushion 22 and the second cushion 24 as well as the motherboard 10 may be reduced, to achieve a better effect of shock absorption.

In addition, at least one of a plurality of modules 13 of the motherboard 10 may be a heating unit 14, such as a processing module. Preferably, the first cushion 22 and the second cushion 24 may be made of a heat-resistant material, for example, but not limited to, heat-resistant rubber materials such as chlorinated rubber, neoprene, chlorosulfonated polyethylene rubber, butyl rubber, polyurethane rubber. Preferably, the second cushion 24 of this embodiment has a heat dissipation portion 244, which is made of a metal material with a high heat conduction speed. The heat dissipation portion 244 is in contact with the heating unit 14 and a heat dissipation structure inside the second casing 23 to conduct a heat source of the heating unit 14 to the heat dissipation structure inside the second casing 23, so as to improve a heat dissipation effect.

Based on the above, according to the electronic device and the housing structure thereof of the application, the housing structure includes the first casing, the first cushion, the second casing, and the second cushion. The first cushion covers the first surface of the motherboard and is accommodated in the first casing. The second cushion covers the second surface of the motherboard and is accommodated in the second casing. Through the foregoing structure, the motherboard is covered between the first cushion and the second cushion, and the motherboard, the first cushion, and the second cushion are jointly accommodated between the first casing and the second casing. The first cushion and the second cushion cover the motherboard to simultaneously achieve the effects of dust prevention, explosion prevention, and shock absorption. In addition, in the interiors of the first casing and the second casing, the first cushion and the second cushion are configured to protect the motherboard, so that even if a negative pressure is drawn due to the explosion-proof test to cause dust to enter the interiors of the first casing and the second casing, the dust may be still prevented from being in contact with the motherboard. Therefore, the explosion-proof test may be passed without reinforcing the strength of the first casing and the second casing and without reducing a current of the motherboard.

The embodiments described above are only used for explaining the technical ideas and characteristics of the application to enable a person skilled in the art to understand and implement the content of the application, and are not intended to limit the patent scope of the application. That is, any equivalent change or modification made according to the spirit disclosed in the application shall still fall within the patent scope of the application.

What is claimed is:

1. An electronic device, comprising:
   a motherboard having a first surface and a second surface opposite to each other; and
   a housing structure comprising:
      a first casing having at least one first fixing member;
      a first cushion covering the first surface of the motherboard and accommodated in the first casing, the first cushion having at least one first through hole;
      a second casing having at least one second fixing member; and
      a second cushion covering the second surface of the motherboard and accommodated in the second casing, the second cushion having at least one second through hole, wherein a peripheral edge of the first cushion is attached to a peripheral edge of the second cushion, and the first fixing member is fixed to the second fixing member through the first through hole and the second through hole.

2. The electronic device according to claim 1, wherein the motherboard has a heating unit, and the first cushion or the second cushion has a heat dissipation portion, the heat dissipation portion is in contact with the heating unit.

3. The electronic device according to claim 1, wherein the first cushion and the second cushion are soft members.

4. The electronic device according to claim 3, wherein the first cushion and the second cushion are made of a heat-resistant material.

5. The electronic device according to claim 1, wherein the first cushion has at least one first side wall, and the second cushion has at least one second side wall, when the first cushion covers the first surface of the motherboard and the second cushion covers the second surface of the motherboard, the first side wall is attached to the second side wall to cover the motherboard.

6. The electronic device according to claim 1, wherein the first cushion has a first inner surface, a surface profile of the first inner surface mates with a surface profile of the first surface of the motherboard, so that the first inner surface is capable of attaching to the first surface of the motherboard, and the second cushion has a second inner surface, a surface profile of the second inner surface mates with a surface profile of the second surface of the motherboard, so that the second inner surface is capable of attaching to the second surface of the motherboard.

7. The electronic device according to claim 1, wherein the first cushion or the second cushion comprises a wire opening, and the housing structure further comprises a waterproof adhesive material, the waterproof adhesive material is filled in the wire opening.

8. The electronic device according to claim 1, wherein the peripheral edge of the first cushion or the second cushion is coated with a waterproof adhesive material.

9. A housing structure of an electronic device, wherein the electronic device comprises a motherboard, the motherboard having a first surface and a second surface opposite to each other and the housing structure comprises:
   a first casing having at least one first fixing member;
   a first cushion covering the first surface of the motherboard and accommodated in the first casing, the first cushion having at least one first through hole;
   a second casing having at least one second fixing member; and
   a second cushion covering the second surface of the motherboard and accommodated in the second casing, the second cushion having at least one second through hole, wherein a peripheral edge of the first cushion is attached to a peripheral edge of the second cushion, and the first fixing member is fixed to the second fixing member through the first through hole and the second through hole.

10. The housing structure of the electronic device according to claim 9, wherein the first cushion or the second cushion has a heat dissipation portion, the heat dissipation portion is in contact with a heating unit of the motherboard.

11. The housing structure of the electronic device according to claim 9, wherein the first cushion and the second cushion are soft members.

12. The housing structure of the electronic device according to claim 11, wherein the first cushion and the second cushion are made of a heat-resistant material.

13. The housing structure of the electronic device according to claim 9, wherein the first cushion has at least one first side wall, and the second cushion has at least one second side wall, when the first cushion covers the first surface of the motherboard and the second cushion covers the second surface of the motherboard, the first side wall is attached to the second side wall to cover the motherboard.

14. The housing structure of the electronic device according to claim 9, wherein the first cushion has a first inner surface, a surface profile of the first inner surface mates with a surface profile of the first surface of the motherboard, so that the first inner surface is capable of attaching to the first surface of the motherboard, and the second cushion has a second inner surface, a surface profile of the second inner surface mates with a surface profile of the second surface of the motherboard, so that the second inner surface is capable of attaching to the second surface of the motherboard.

15. The housing structure of the electronic device according to claim 9, wherein the first cushion or the second cushion comprises a wire opening, and the housing structure further comprises a waterproof adhesive material, the waterproof adhesive material is filled in the wire opening.

16. The housing structure of the electronic device according to claim 9, wherein a peripheral edge of the first cushion or the second cushion is coated with a waterproof adhesive material.

\* \* \* \* \*